(12) United States Patent
Kuroda (10) Patent No.: US 7,565,518 B2
(45) Date of Patent: Jul. 21, 2009

(54) SEMICONDUCTOR DEVICE AND METHOD OF CONTROLLING THE SEMICONDUCTOR DEVICE

(75) Inventor: Susumu Kuroda, Kasugai (JP)

(73) Assignee: Fujitsu Microelectronics Limited, Tokyo (JP)

(*) Notice: Subject to any disclaimer, the term of this patent is extended or adjusted under 35 U.S.C. 154(b) by 495 days.

(21) Appl. No.: 11/063,992

(22) Filed: Feb. 24, 2005

(65) Prior Publication Data

US 2005/0141301 A1 Jun. 30, 2005

Related U.S. Application Data

(63) Continuation of application No. PCT/JP03/15908, filed on Dec. 11, 2003.

(30) Foreign Application Priority Data

Feb. 13, 2003 (JP) ............... 2003-034731

(51) Int. Cl.
*G06F 9/00* (2006.01)
(52) U.S. Cl. ............... 713/1; 713/2
(58) Field of Classification Search ............ 713/1, 713/2, 100; 714/167; 710/36, 58
See application file for complete search history.

(56) References Cited

U.S. PATENT DOCUMENTS 5,619,469 A * 4/1997 Joo ............... 365/225.7
6,084,803 A 7/2000 Sredanovic et al. .... 365/189.05
6,281,739 B1 8/2001 Matsui
6,552,960 B2 * 4/2003 Shirai et al. ............... 365/233

FOREIGN PATENT DOCUMENTS

| CN | 1241000 A | 1/2000 |
|---|---|---|
| JP | 03-083298 | 4/1991 |
| JP | 10-334689 | 12/1998 |
| JP | 2000-036192 | 2/2000 |
| JP | 2002-175696 | 6/2002 |
| JP | 2002-298594 | 10/2002 |

* cited by examiner

*Primary Examiner*—Thomas Lee
*Assistant Examiner*—Paul B Yanchus, III
(74) *Attorney, Agent, or Firm*—Arent Fox LLP

(57) ABSTRACT

A semiconductor device and a control method therefor capable of reliably reading control parameter information from an information storage portion and holding the same in an internal circuit upon turning-ON of a power source, in which the fuse reading signal is actuated by a power-ON reset signal POR to start reading for the fuse information and it continues till the first command entry signal. The read out information is defined by the first command entry signal and held in the holding portion. A correct fuse information is read and held at a sufficient power source voltage level and for a sufficient time from the rising of the power source voltage VDD to a predetermined level to a stable voltage level, and erroneous fuse information is not held.

14 Claims, 10 Drawing Sheets

SEMICONDUCTOR DEVICE AND METHOD OF CONTROLLING THE SEMICONDUCTOR DEVICE

CROSS-REFERENCE TO RELATED APPLICATIONS

This application is a continuation application based upon and claims the benefit of the prior PCT International Patent Application No. PCT/JP03/15908 filed on Dec. 11, 2003, the entire contents of which are incorporated herein by reference.

BACKGROUND OF THE INVENTION

1. Field of the Invention

The present invention concerns a semiconductor device for reading various control parameter information stored in an information storage portion such as a fuse and a controlling method therefor. It particularly relates to a semiconductor device capable of reliably reading control parameter information from an information storage portion and keeping the same in an internal circuit upon turning-ON of a power source, as well as a controlling method thereof.

2. Description of the Related Art

In a semiconductor device, by properly cutting a fuse provided in a fuse circuit disposed in the device, redundant address information, operation specification information, etc. are stored. Such pieces of information are read into the internal circuit and held upon turning-ON of a power source and supplied to a circuit to be controlled. For example, a fuse circuit 100 disclosed in Japanese Patent Application No. 2001-354402 as a prior application filed by the present applicant (FIG. 6) comprises a fuse portion 120, a transfer portion 130 and a holding portion 140.

Figure 6:
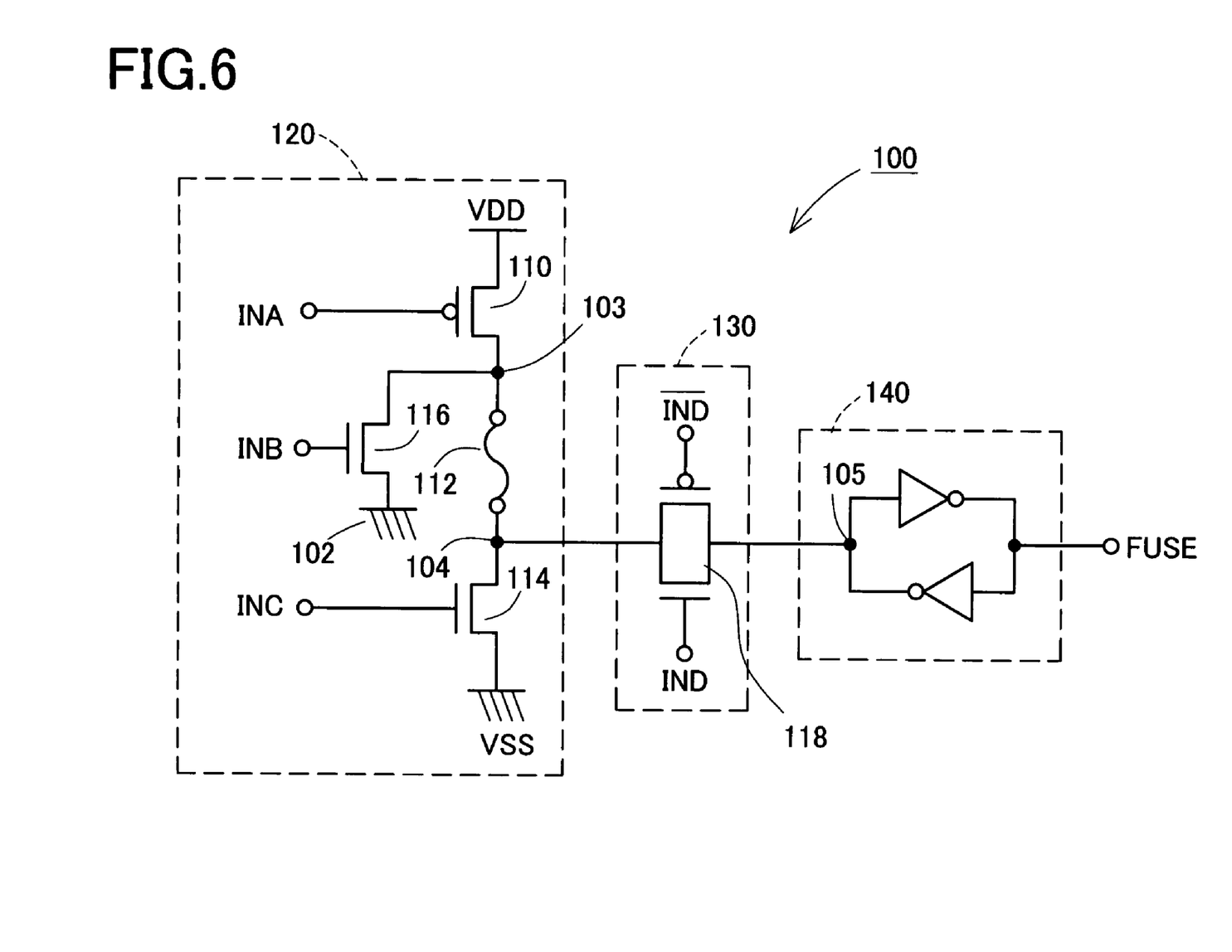
FIG. 6 is a circuit diagram showing a fuse circuit in the prior application of the present applicant.

In the fuse portion 120, fuse information is read by control signals INA, INB, and INC. A fuse 112 is connected between a node 103 and a node 104 A PMOS transistor 110 is connected between the node 103 and a power source voltage VDD. An NMOS transistor 114 is connected between the node 104 and a ground voltage VSS. An NMOS transistor 116 is connected between the node 103 and the ground voltage VSS. Then, the control signals IN, INB, and INC are generated in a power source detection circuit (not illustrated) based on a power-ON reset signal POR (not illustrated) for detecting the rise of the power source voltage VDD. The power-ON reset signal POR is a pulse signal having a pulse width of a first period (P1) and the control signals INA, INB, and INC are outputted in accordance with the pulse signal (refer to FIG. 7).

Figure 7:
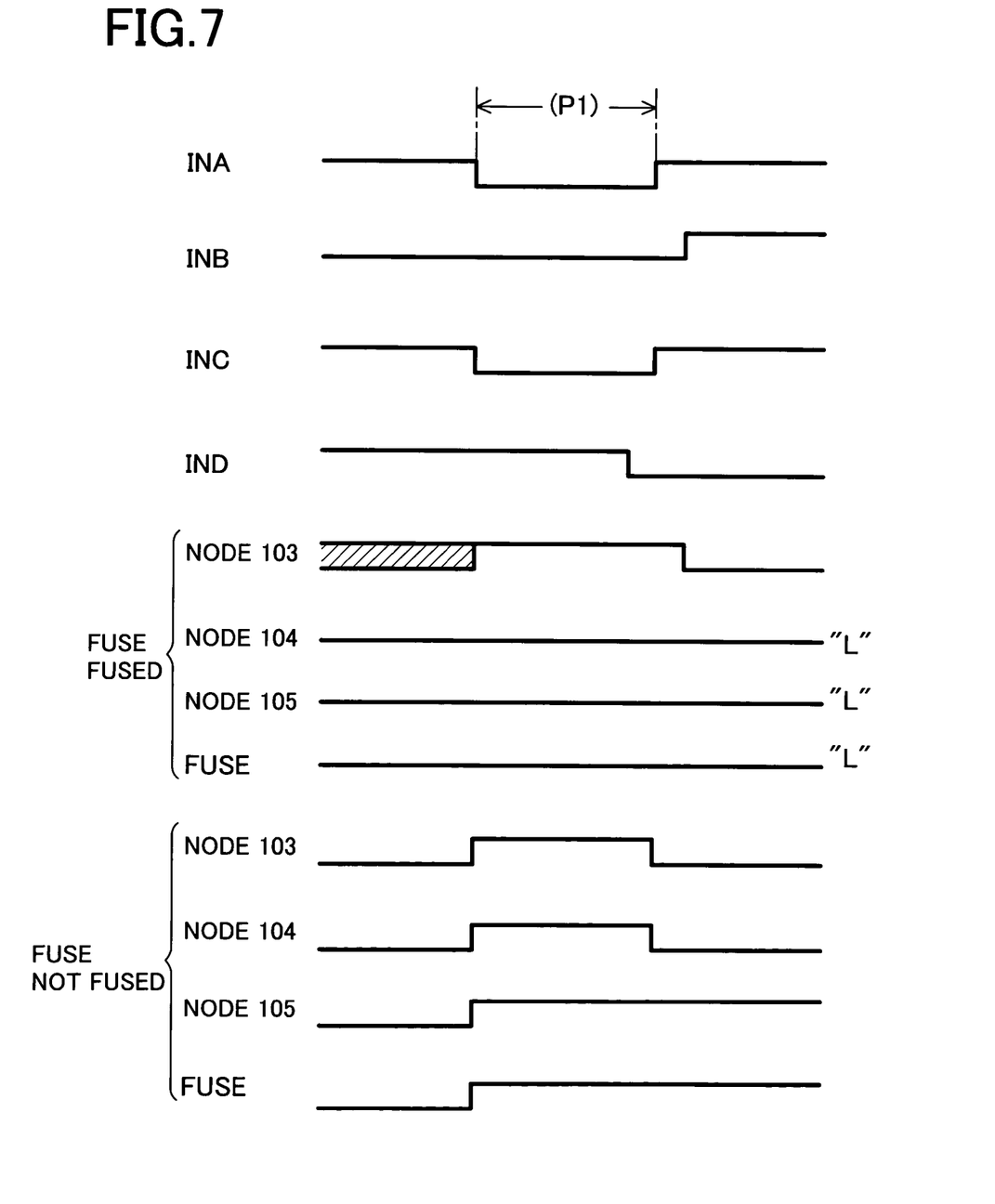
FIG. 7 is a timing chart for a fuse circuit in FIG. 6.

In the first period (P1) in FIG. 7, the control signal INA is at the ground voltage level upon rise of the power-ON reset signal POR (not illustrate). The PMOS transistor 110 turns ON for the first period (P1) being controlled by the control signal INA to connect the node 103 with the power source voltage VDD. The NMOS transistor 114 turns ON before and after the first period (P1) being controlled by the control signal INC which is a signal cophasal with the control signal INA and turns OFF for the first period (P1).

In a case where the fuse is not fused, the voltage level at the node 104 is at the voltage level of the power source voltage VDD by the turning-ON of the PMOS transistor 110. After the completion of the first period (P1), the voltage level at the node 103 and the node 104 is fixed to the voltage level of the ground voltage VSS by the NMOS transistor 114 and the NMOS transistor 116 that turns ON with a delay by the control signal INB.

In a case where the fuse is fused, the voltage level at the node 103 is not transmitted to the node 104 even when the PMOS transistor 110 turns ON. Accordingly, the voltage at the node 104 is kept at the voltage level of the ground voltage VSS.

The transfer portion 130 transfers the fuse information from the fuse portion 120 to the holding portion 140 by the control signal IND. A transfer gate 118 is connected between the node 104 and the node 105 and turns ON in the former half of the first period (P1) and turns OFF in the latter half of the first period (P1) by the control signal IND,/IND. During the ON-period of the transfer gate 118, the voltage level at the node 104 is transmitted to the node 105.

The holding portion 140 holds the fuse information transferred by the transfer portion 130 and outputs it as fuse signal FUSE. A high level is outputted in a case where the fuse is not fused, while a low level is outputted in a case where it is fused.

Figure 8:
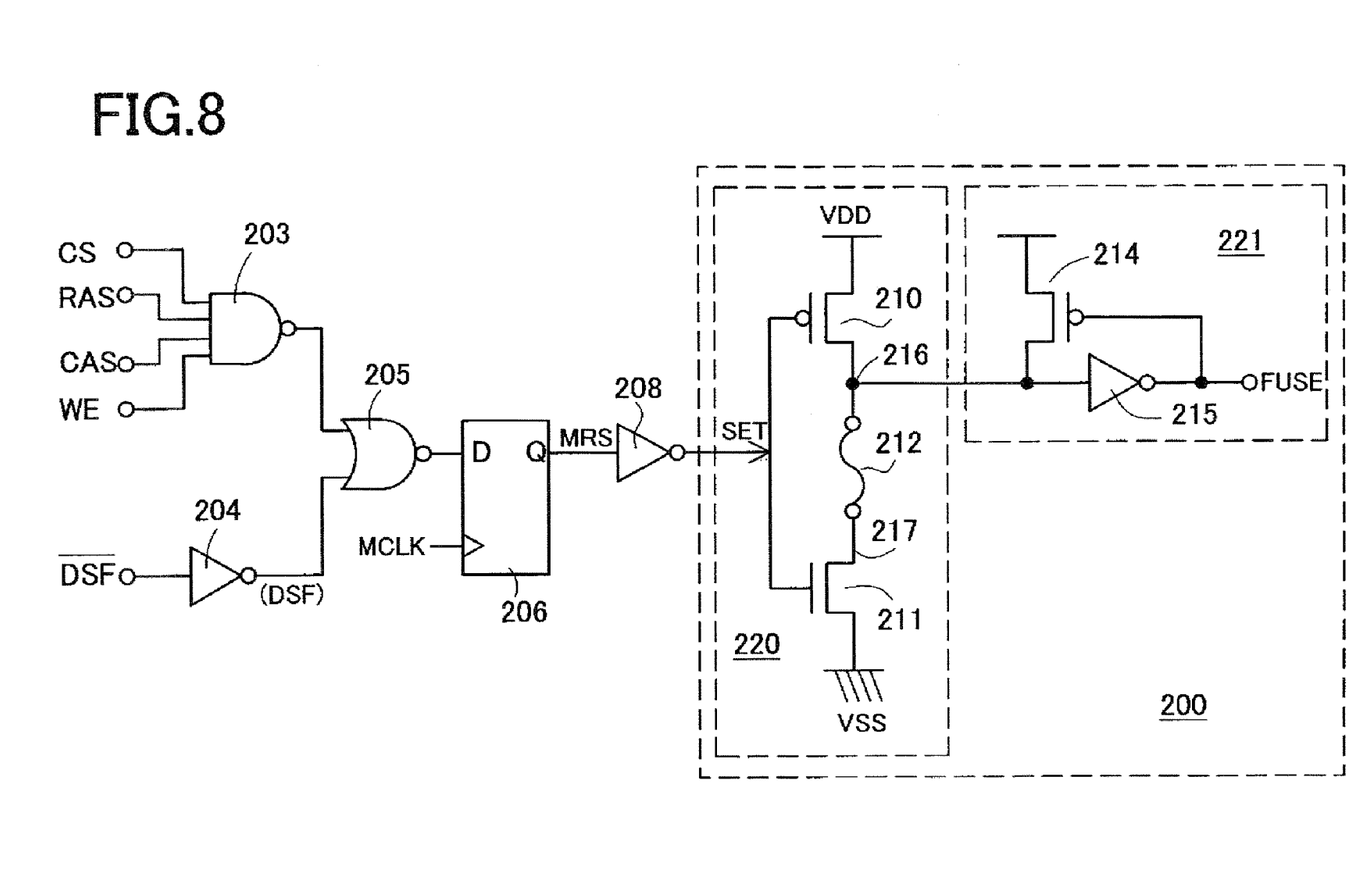
FIG. 8 is a circuit diagram of a semiconductor device disclosed in Patent Document 1.

FIG. 8 shows a semiconductor device disclosed in Patent Document 1. An input signal from each of input terminals is judged by an NAND gate 203, an inverter gate 204, and an NOR gate 205, and is outputted from a flip-flop circuit 206 as a mode register set signal MRS in accordance with a clock signal MCLK. The mode register set signal MRS is inverted by an inverter gate 208 and inputted as a set signal SET to a fuse circuit 200.

The fuse circuit 200 comprises a fuse portion 220 and a holding portion 221. In the fuse portion 220, a fuse 212 is connected between a node 216 and a node 217. A PMOS transistor 210 is connected between the node 216 and a power source voltage VDD. An NMOS transistor 211 is connected between the node 217 and a ground voltage VSS. The holding portion 221 comprises an inverter gate 215 and a PMOS transistor 214 and is connected with the node 216. The voltage level at the node 216 is inverted and held in the holding portion 221 to output a fuse signal FUSE in accordance with the voltage level at the fuse 212.

Figure 9:
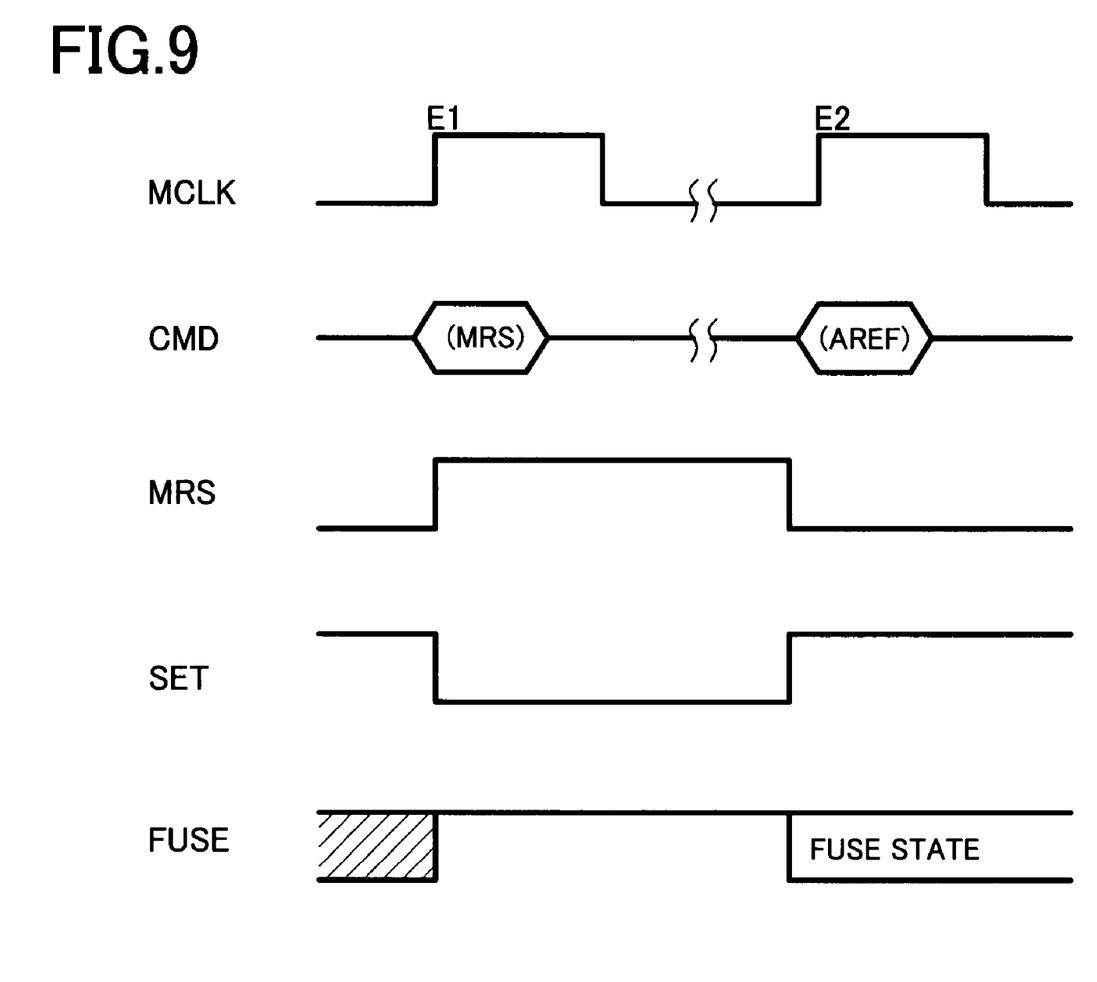
FIG. 9 is a timing chart of the semiconductor device in FIG. 8.

FIG. 9 shows a timing chart. At a clock cycle E1, a mode register set signals MRS is actuated by a mode register set command (MRS) to activate a set signal SET. Then, at a clock cyclic E2, the mode resistor set signal MRS is inactivated by an autorefresh command (AREF) to inactuate the set signal SET. The PMOS transistor 210 in the fuse portion 220 is controlled by the set signal SET, and turns ON in a period from clock cycles E1 to E2. Further, the NMOS transistor 211 is controlled in the same manner by the set signal SET, turns OFF in the period for the clock cycles E1 to E2 and turns ON before and after thereof.

In a case where the fuse 212 is not fused, while the voltage level at the node 216 takes a high level by the turning-ON of the PMOS transistor 210 at the clock cycle El, but takes a low level by the turning-ON of the NMOS transistor 211 in the clock cycle E2.

In a case where the fuse 213 is not fused, the MOS transistor turns ON to a high level in the clock cycle E1. However, in the clock cycle E2, since the fuse 212 is fused, the node 216 keeps the high level even when the NMOS transistor 211 turns ON.

In the holding portion 221, after the clock cycle E2, fuse information is held in accordance with the state of the fuse 212 to output a fuse signal FUSE.

Other relevant technique includes a fuse circuit disclosed in Patent Document 2. It comprises a structure in which the fuse circuit is divided into two groups and the operation timing is deviated between the groups. However, the group that operates at first is actuated in the same manner as in Japanese Patent Application No. 2001-354402 or the Patent Document 1 described above.

The prior art documents described above are as shown below.

Patent Document 1: U.S. Pat. No. 6,084,803 Specification
Patent Document 2: JP-A No. 2002-175696

Figure 10:
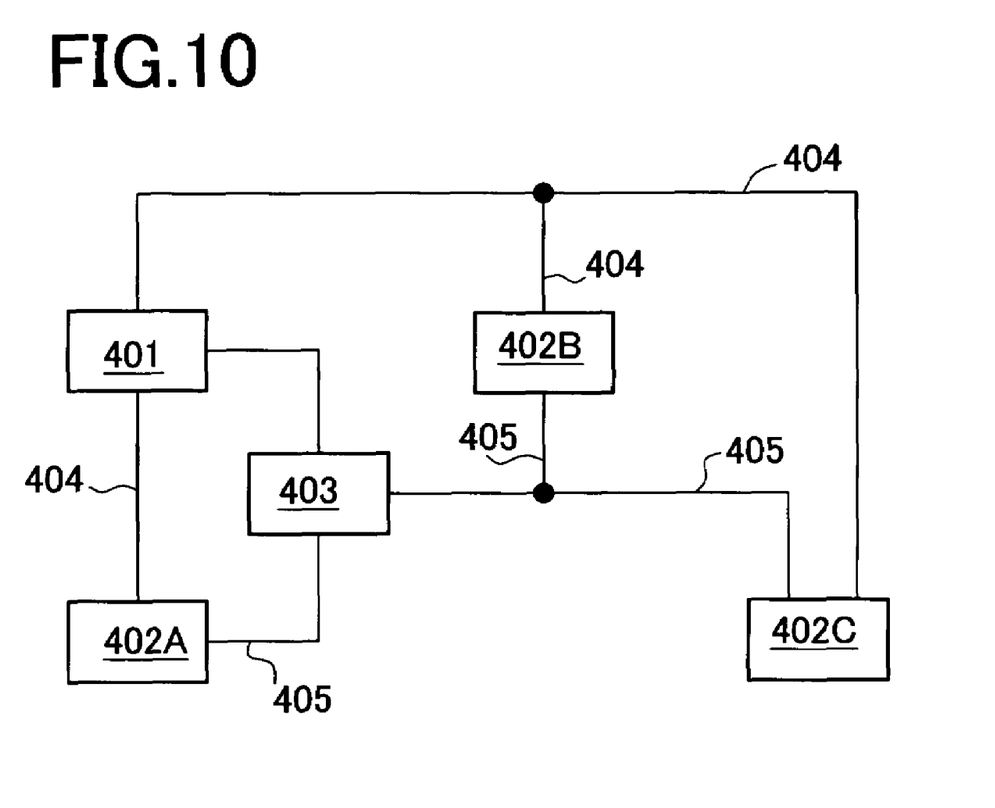
FIG. 10 is a schematic view showing an example for the arrangement of a power source detection circuit and a fuse circuit.

In Japanese Patent Application No. 2001-354402 as the prior application of the present applicant, the signals INA, INB, INC, IND,/IND are generated based on the power-ON reset signal POR. Generally, a power source detection circuit for generating the power-ON reset signal POR is provided by one to a predetermined place of a device. On the other hand, the fuse circuit 100 is sometimes arranged being scattered to appropriate places on the device for handling versatile information such as device redundant address information, operation specification information, etc. FIG. 10 shows the state. Fuse circuits 402A, 402B, and 402C are arranged to respective positions to a power source detection circuit 401. Accordingly, the parasitic loads on the signal line 404 from the power source detection circuit 401 to the fuse circuits 402A, 402B, and 402C are different respectively. In the same manner, the parasitic loads on the power source line 405 from the power source 403 to each of the fuse circuits 402A, 402B, and 402C are different respectively. Further, taking notice on one fuse circuit (for example, 402A), the signal line 404 from the power detection circuit 401 and the power source line 405 from the power source 403 may sometimes have the parasitic load different from each other.

Therefore, it may be considered that deviation is caused for the propagation speeds of signals INA, IBN, INC, IND,/IND depending on the parasitic capacitance of the signal line 404, and the margin for the transition timing between the signals may be lost. A correct circuit operation can not possibly be obtained to bring about a problem.

Further, in each of the fuse circuits 402A, 402B, and 402C, the time constant for the rising of the power source voltage supplied by way of the power source line 405 and the propagation time constant of the signals INA, IBN, INC, IND,/IND transmitted by way of the signal line 404 may sometimes be different from each other. In a case where the signals INA, IBN, INC, IND,/IND are transmitted in a state where no sufficient voltage level is supplied as the power source voltage, it may be a possibility that the level of the transmitted signal can not be correctly recognized, or a possibility that no correct output result can be obtained due to slow circuit operation, which brings about a problem.

In Patent Document 1, a problem exists in a case where the first command after the turning-ON of the power source is a command different from an initialization command of the device such as a mode register set command. For example, in a case of a write command, it is necessary to refer to a fuse information necessary for the writing operation. Accordingly, it is required to delay the operation of an internal circuit for a time till the fuse information is defined, which may possibly degrade the high speed operation performance to bring about a problem.

Further, in a case where a read command is inputted succeeding to the first command, after the turn ON of the power source, the fuse information necessary for the read operation is defined at the start of the read command. The fuse information may be inverted by the power source noise, etc. accompanying the first command operation before definition of the fuse information to possibly define an erroneous fuse information which brings about a problem.

The present invention has been achieved in order to solve at least one of the problems in the prior art. That is, it intends to provide a semiconductor device capable of reliably reading control parameter information from the information storage portion and hold the same in the internal circuit upon turning-ON of the power source, as well as a control method thereof.

SUMMARY OF THE INVENTION

For attaining the foregoing object, a semiconductor device according to one aspect comprises an information storage portion in which reading for a stored control parameter information is started based on a first initializing signal that instructs a first initializing operation after turning-ON of a power source and the reading is completed based on a second initializing signal that instructs a second initializing operation and an information holding portion for holding the read out control parameter information.

In the semiconductor device of the one aspect, the control parameter information from the information storage portion is read from the time based on the first initializing signal that instructs the first initializing operation after turning-ON of the power source to the timing based on the second initializing signal that instructs the second initializing operation, and held in the information holding portion.

The semiconductor according to a second aspect comprises an information storage portion connected between a first node and a second node for storing control parameter information, a first switch portion connected between the first node and a first power source and rendered conductive based on the first initializing signal and rendered non-conductive based on the second initializing signal, a second switch portion connected between the second node and a second power source, rendered conductive before conduction of the first switch portion based on the first initializing signal and rendered non-conductive during the conduction period of the first switch portion and, further, rendered conductive after the non-conduction of the first switch portion based on the second initializing signal, a transfer portion connected between the second node and a third node and rendered non-conductive before conduction of the second switch portion based on the second initializing signal, and an information holding portion connected with the third node for holding the control parameter information transmitted to the third node.

In the semiconductor device of the second aspect, the first power source is supplied to the information storage portion connected with the first node by way of the first switch portion which is rendered conductive based on the first initializing signal. Supply of the first power source to the first node is continued till the first switch portion is rendered non-conductive based on the second initializing signal. Meanwhile, the first power source is transmitted in accordance with a predetermined state of the information storage portion to the second node and transmitted as the control parameter information by way of the transfer portion to the third node. The information holding portion holds the control parameter information transmitted to the third node. The second switch portion is rendered non-conductive during the conduction period of the first switch portion and rendered conductive before conduction of the first switch portion based on the first initializing signal and rendered conductive after the non-conduction of the first switch portion based on the second initializing signal to supply the second power source to the second node.

Further, the control method for a semiconductor device of a third aspect comprises a step for starting reading the stored control parameter information based on the first initializing operation instruction after the turning-ON of the power source, a step for completing reading based on the second initializing operation instruction, and a step for holding the control parameter information which has been read till the step for completing the reading.

In the method of controlling the semiconductor device of the third aspect, the stored control parameter information is read from the start of reading based on the first initializing operation instruction after the turning-ON of the power source in the step for reading starting till the completion of the reading based on the second initializing operation instruction in the step for reading completion and the control parameter information read out in this period is held at the holding step.

This can ensure a sufficiently long time from the timing based on the first initializing signal or the first initializing operation instruction to the timing based on the second initializing signal or the second initializing operation instruction as a reading period for the control parameter information.

Further, it may suffice to hold the control parameter information after the reading period with a sufficient time being ensured and it is no more necessary to adjust the signal transition timing between the reading operation and the holding operation for the control parameter information. The operation margin for the reading operation or the holding operation does not lack in view of the competition of the transition timings between the signals and the holding operation can be conducted after the stable reading operation.

Further, since the sufficient reading period is ensured, even in a case where pieces of the control parameter information are arranged being dispersed on appropriate positions on the semiconductor device, individual control parameter information can be read reliably irrespective of the difference of the load on the supply path of the power source voltage and the load on the signal transmission path.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Now, embodiments embodied for a semiconductor device and a control method for the semiconductor device according to the present invention are to be described specifically with reference to the drawings based on FIG. 1 to FIG. 5.

Figure 1:
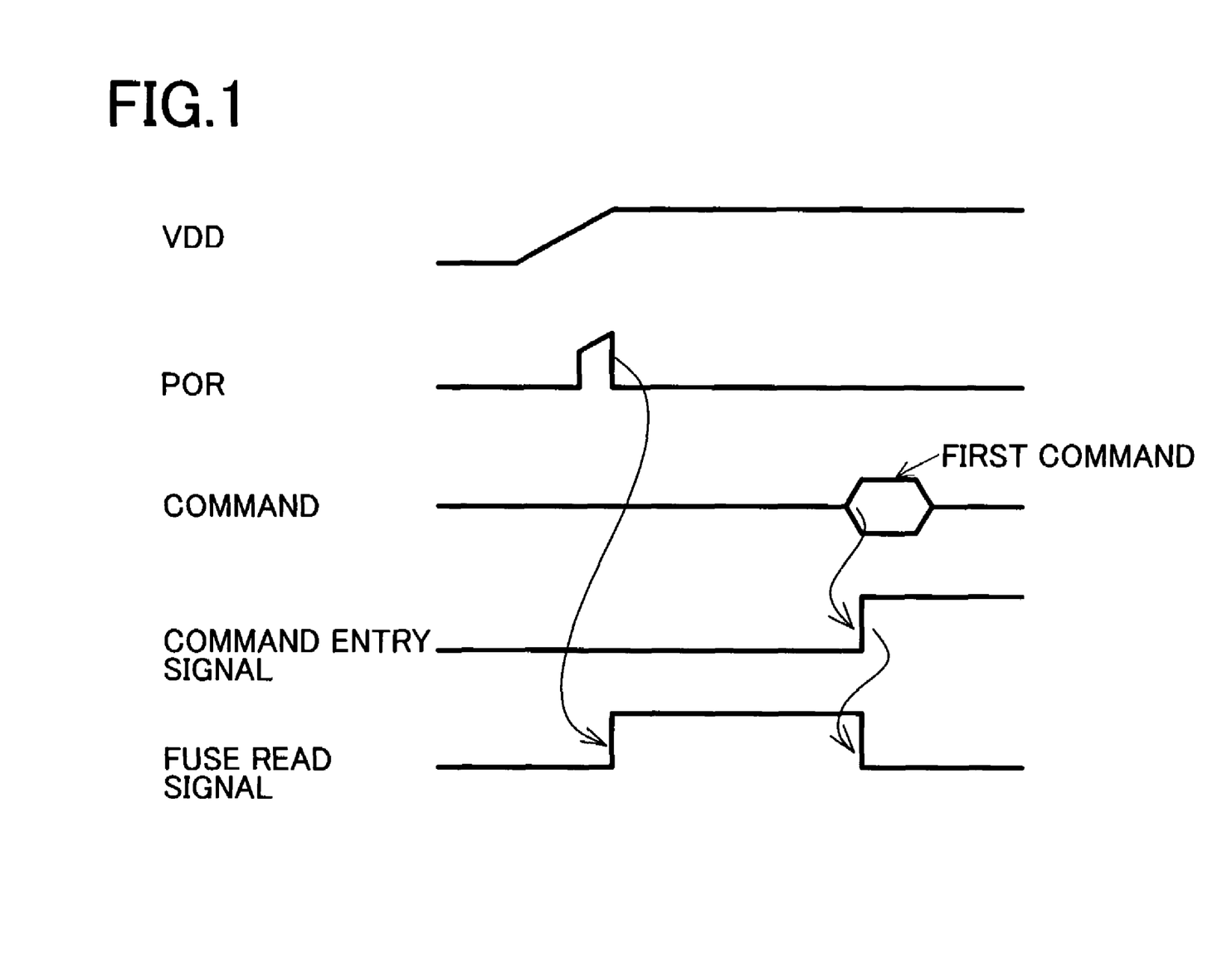
FIG. 1 is a timing chart showing the principle of the present invention.

The principle of the invention is to be described based on a timing chart of FIG. 1. A power source voltage VDD rises upon turning-ON of a power source. A power-ON reset signal POR is generated as a pulse signal by a power source detection circuit that detects the rising of the power source voltage VDD. A fuse reading signal is actuated by the power-ON reset signal POR to conduct reading for the fuse information. Reading for the fuse information is conducted continuously from the power-ON reset signal POR to a first command entry signal. The read information is defined at the first command entry signal and held in a holding portion.

Then, the command entry signal is a signal generated by the recognition for the input of the command. Generally, the timing at which the first command is inputted is after the reaching of the voltage level for the power source voltage VDD to a predetermined level and after the power source voltage VDD rises and is stabilized. Thus, fuse information is read in a period from the rising of the power source voltage VDD to a predetermined voltage level till a stable voltage level. A correct fuse information is read out and held together with a sufficient power source voltage level and in a sufficient time. No erroneous fuse information is held.

Accordingly, even in a case where the period from the power-ON reset signal POR till the issue of the first command is restricted to a short time, the power source voltage VDD has raised to such a voltage level as causing no trouble to the circuit operation at the instance the first command is issued and the reading operation and the holding operation for the fuse information are conducted correctly. No erroneous fuse information is held.

Figure 2:
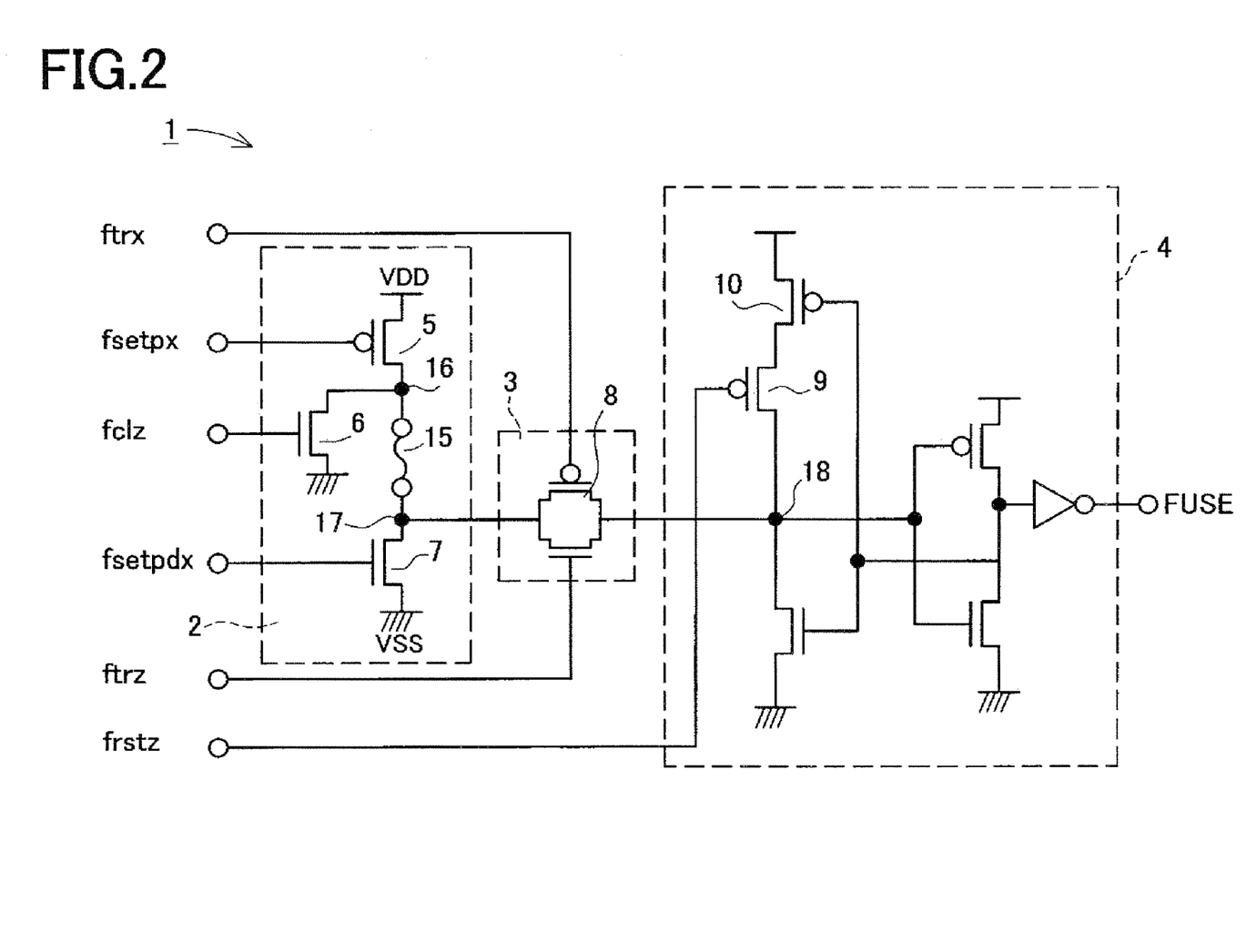
FIG. 2 is a circuit diagram showing a fuse circuit of Embodiment 1.

FIG. 2 is an example in a case of applying the invention to a fuse circuit 1 as Embodiment 1. The fuse circuit 1 comprises a fuse portion 2, a transfer portion 3 and a holding portion 4. Transfer signals ftrx and ftrz complimentary to each other are inputted to a PMOS transistor and NOS transistor in the transfer gate 8 in the transfer portion 3. Control signals fsetpx, fclz, fsetpdx are inputted to the PMOS transistor 5, NMOS transistor 6, and NMOS transistor 7, respectively. The control signal frstz is inputted to the PMOS transistor 9 in the holding portion 4. A fuse 15 is connected between nodes 16 and 17. The PMOS transistor 5 connected between the node 16 and the power source voltage VDD, the PMOS transistor 5 is connected between the node 16 and the power source voltage VDD. The NMOS transistor 7 is connected between a node 17 and the ground voltage VSS. The NMOS transistor 6 is connected between the node 16 and the ground voltage VSS. The transfer gate 8 in the transfer portion 3 connects the node 17 in the fuse portion 2 and the node 18 in the holding portion 4. The holding portion 4 holds the voltage level transmitted to the node 18 and outputs a fuse signal FUSE in accordance with the held voltage level.

Figure 3:
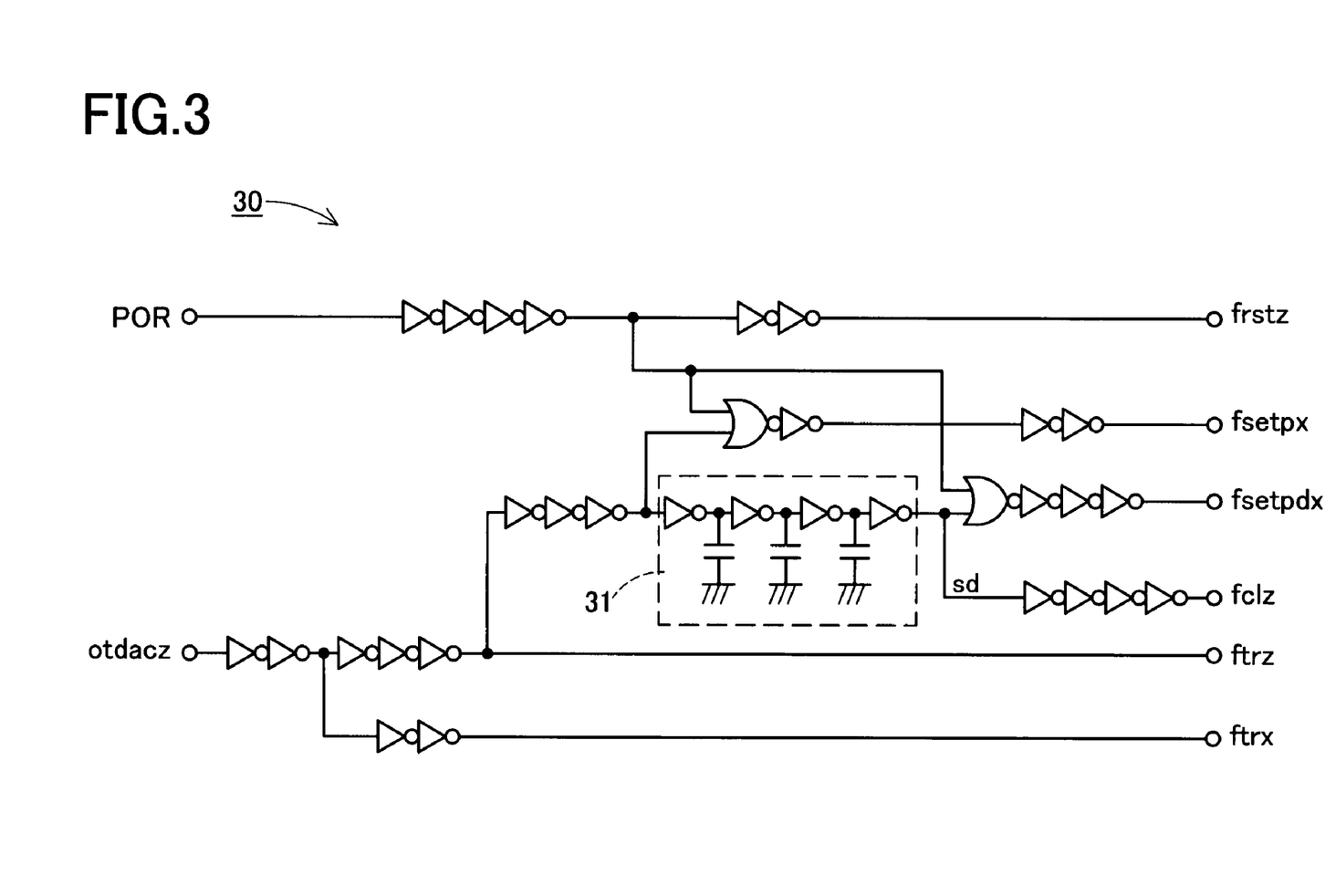
FIG. 3 is a circuit diagram showing a generation circuit for a control signal and a transfer signal.

FIG. 3 is an example of a generation circuit 30 for transfer signals ftrx, ftrz and control signals fsetpx, fclz, fsetpdx, and frstz. In the generation circuit 30, the transfer signals ftrx and ftrz are generated by way of an inverter gate from a command entry signal otdacz. Specifically, from a command entry signal otdacz, a transfer signal ftrx as a same phrase signal is outputted by way of a four stage inverter gate. Further from the command entry signal otdacz, a transfer signal ftrz as an inverted signal is outputted by way of a five stage inverter gate.

The control signal frstz is generated from a power-ON reset signal POR by way of a sixth stage inverter gate. The control signal fsetpx is a signal obtained from a logic OR output for a same phrase signal obtained from a power-ON reset signal POR by way of a four stage inverter gate and an inverted signal obtained from the transfer signal ftrz by way of a three stage inverter gate, further by way of a two stage inverter gate. The control signal fsetpdx is a signal obtained from a logic OR output for a same phrase signal obtained from the power-ON reset signal POR by way of a four stage inverter gate and a delay signal sd by way of a delay portion 31 with addition of a delay time τ and, further, by way of a two stage inverter gate. The control signal fclz is a signal obtained from a delay signal sd from a delay portion 31, by way of a four stage inverter gate.

Figure 4:
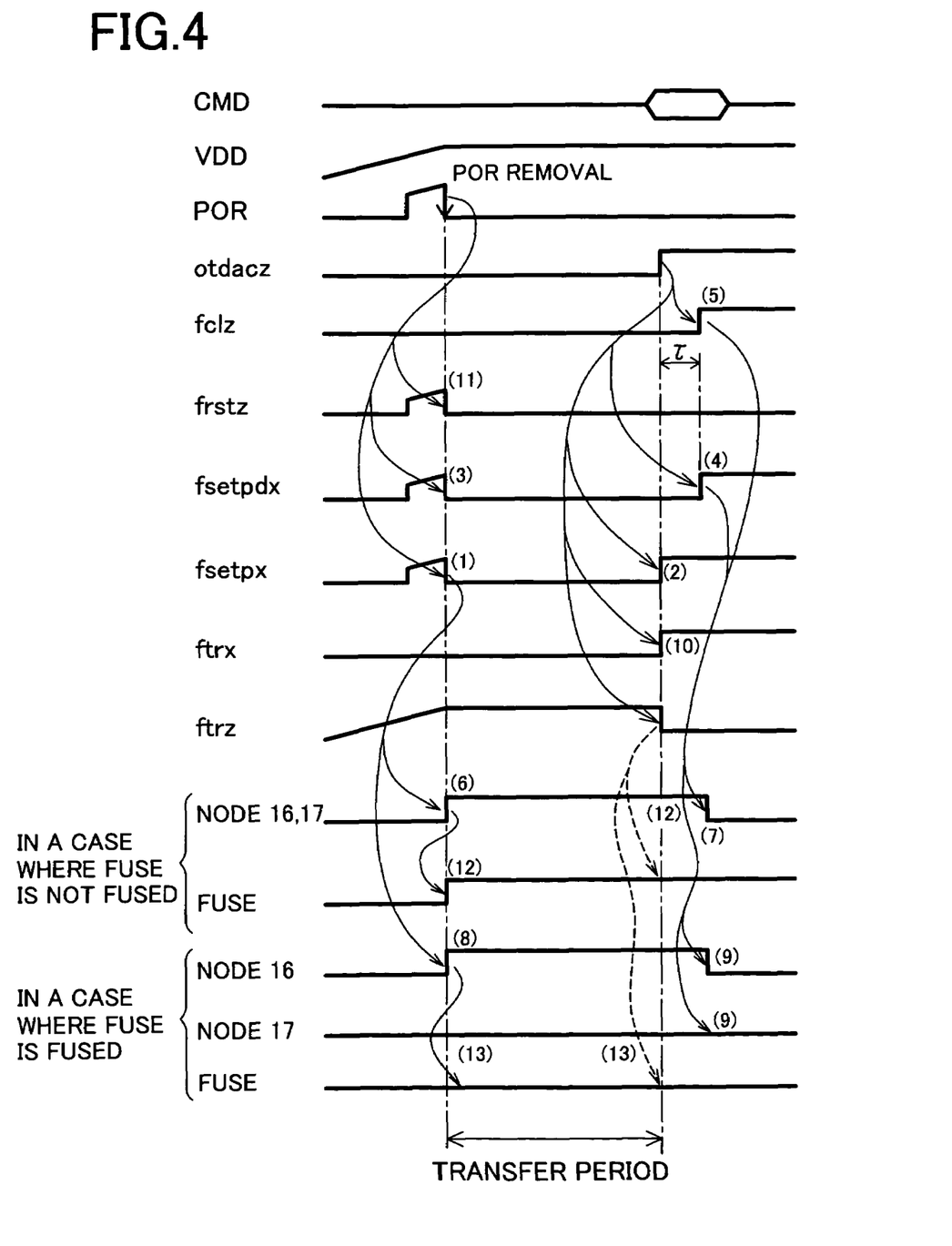
FIG. 4 is a timing chart of a fuse circuit of Embodiment 1.

FIG. 4 is an operation timing chart for the fuse circuit 1 (FIG. 2). In the fuse portion 2, the PMOS transistor 5 is controlled by the control signal fsetpx. The control signal fsetpx transits to a low level by the removal of the power-ON reset signal POR (FIG. 4(1)) and again transfers to a high level by the high level transmission of a command entry signal otdacz by the first command after turning-ON of the power source (FIG. 4(2)). The PMOS transistor 5 turns ON in the period where the control signal fsetpx is at a low level to connect the power source voltage VDD to the node 16. The NMOS transistor 7 is controlled by the control signal fsetpdx. The control signal fsetpdx transits to the low level by the removal of the power-ON reset signal POR (FIG. 4(3)), and then again transits to the high level after a delay time τ set by the delay portion 31 from the high level transition of the command entry signal otdacz (FIG. 4(4)). The NMOS transistor 7 turns OFF in the period where the control signal fsetpdx is at the low level and turns ON in the high level period before and after thereof to connect the ground voltage VSS to the node 17. The NMOS transistor 6 is controlled by the control signal fclz. The control signal fclz transits to the high level after a delay time τ set by the delay portion 31 from the high level transition of the command entry signal otdacz after delay time τ set by the delay portion 31 from the high level transition of the command entry signal otdacz (FIG. 4(5)). The NMOS transistor 6 turns OFF in the period where the control signal fclz is at the low level and turns ON at a subsequent high level period to connect the ground voltage VSS to the node 16.

The NMOS transistors 6, 7 transit to the high level after the delay time τ from the high level transition of the command entry signal otdacz, to set the nodes 16, 17 on both ends of the fuse 15 to the ground voltage VSS. Terminals of the fuse 15 are fixed at an identical potential, and aging deterioration of the fuse cutting resistance such as a glow back phenomenon can be prevented.

In a case where the fuse is not fused, the voltage level of the node 16 is transmitted as it is to the node 17. Accordingly, the node 17 transits to the high level by the turning-ON of the PMOS transistor 5 by the Control signal fsetpx (FIG. 4(6)). Then, nodes 16 and 17 transit to the low level by the turning-ON of the NMOS transistors 6 and 7 by the control signals fclz and fsetpdx (FIG. 4(7)).

In a case were the fuse is fused, node 16 is not transmitted to the node 17 since the path is shut even by the transition to the high level by the turning-ON of the PMOS transistor 5 by the control signal fsetpx (FIG. 4(8)). Accordingly, the voltage level at the node 17 is kept at the low level. Then, the node 17 is initialized to the low level by being discharged to the ground voltage VSS in accordance with the high level transition of the signal fsetpdx in synchronization of the power-ON reset signal POR. Then, the node 16 transits to the low level since the NMOS transistor 6 is turned ON by the control signal fclz (FIG. 4(9)). Further, also the node 17 is kept at the low level since the NMOS transistor 7 turns ON by the control signal fsetpdx (FIG. 4(9)).

In the transfer portion 3, the transfer gate 8 is controlled by transfer signals ftrx and ftrz complimentary to each other. The transfer signal ftrx transits to the high level by a command entry signal otdacz, while the transfer signal ftrz transits to the low level by the command entry signal otdacz (FIG. 4(10)). The transfer gate 8 turns ON in a period where the transfer signal ftrx is at the low level and the transfer signal ftrz is at the high level, to transfer the voltage level at the node 17 to the node 18.

In the holding portion 4, the PMOS transistor 9 is controlled by the control signal frstz. The control signal frstz transits to the high level in synchronization with the power-ON reset signal POR. Since the PMOS transistor 9 turns OFF correspondingly, the path from the power source voltage VDD by way of the PMOS transistor 10 to the node 18 is shut. At the same time, since the NMOS transistor 7 turns ON, the node 18 is connected by way of the transfer portion 3 to the ground voltage VSS. Thus, the node 18 is set to the low level and the holding portion 4 is initialized.

Then, by the removal of the power-ON reset signal POR, the control signal frstz transits to the low level (FIG. 4(11)). The PMOS transistor 9 turns ON when the control signal frstz transits to the low level and connects the PMOS transistor 10 and the node 18 to constitute a latch circuit. The holding portion 4 holds the voltage of the node 18 to output a fuse signal FUSE.

About at the same time as the establishment of the latch circuit in the holding portion 4 by the transition of the control signal frstz to the low level, the transfer gate 8 turns ON to transfer the fuse information to the holding portion 4. Then, a sufficient period from the issue of the initial command till the transition of the transfer signal ftrx/ftrz to high/low level can be ensured as the transfer period. During the transfer period, the latch circuit is constituted in the holding portion 4, and fuse information is held in the holding portion 4 with a sufficient margin in view of time. That is, in a case where the fuse is not fused, the high level at the node 17 is transferred and held (FIG. 4(12)). In a case where the fuse is fused, the initialized level of the node 18 is maintained to hold the low level (FIG. 4(13)).

In this case, input of the first command after the turning-ON of the power source is conducted after the power source voltage VDD rises and is stabilized sufficiently. Thus, the fuse information can be defined at the instance where the first command with the stabilized power source voltage VDD is inputted and correct fuse information can reliably be transferred and held in combination with the sufficiently long transfer time. Erroneous operation caused by the effect of the parasitic load can be prevented even in a case where the fuse circuit 1 is arranged at any position in the device.

Further, the fuse information is defined and held in the holding portion 4 by turning-OFF the transfer portion 4 in accordance with the command entry signal otdacz. With this constitution, the fuse information is defined at the stage prior to the conduction of the operation by the command and erroneous inversion of the fuse information due to the power source noises generated by the command operation is not generated.

In a case where the fuse is not fused, after the fuse information is defined in the holding portion 4 by the command entry signal otdacz in the holding portion 4, A high level is held to the node 18. On the other hand, the node 17 is maintained at the low level subsequently. Therefore, a voltage level at the power source voltage VDD is applied between the terminals of the transfer gate 8 and OFF leak current flows to the transfer gate 8 depending on the voltage level. Then, in the semiconductor device mounted to a battery driven system, it is necessary to suppress the OFF leak current of an MOS transistor to decrease the consumption current during stand-by as much as possible in order to extend the battery driving time. While the OFF leak current generated in one fuse circuit 1 is about several nA, since several thousands of fuse circuits 1 are used in a general semiconductor device, the current amounts to several μA as the entire device. Then it is necessary to decrease the OFF leak current in the transfer gate 8.

The OFF leak current can be decreased by decreasing the size of the transfer gate 8 as far as possible. However, it may be considered that the ON-resistance of the transfer gate 8 increases at the same time to decrease the current driving performance. In JP-A No. 2001-354402 as the prior application of the present applicant, this may possibly decrease the margin of the take-in time to the holding portion.

In the present invention, a sufficient transfer time can be ensured upon transfer of the fuse information to the holding potion 4. Therefore, it is possible to reliably intake the fuse information to the holding potion 4 even for the decrease of the current driving performance while minimizing the OFF leek current by reducing the transfer gate 8 to the minimum size. Suppression of the OFF leak current and reliable in-take of the fuse information to the holding potion 4 in the transfer gate can be made compatible.

Further, after turning-OFF of the PMOS transistor 5, the NMOS transistors 6 and 7 turn ON after the laps of the delay time τ set in the delay circuit 31. This can prevent through current upon switching of the conduction estate of the MOS transistors 5 to 7 in the fuse potion 2.

Figure 5:
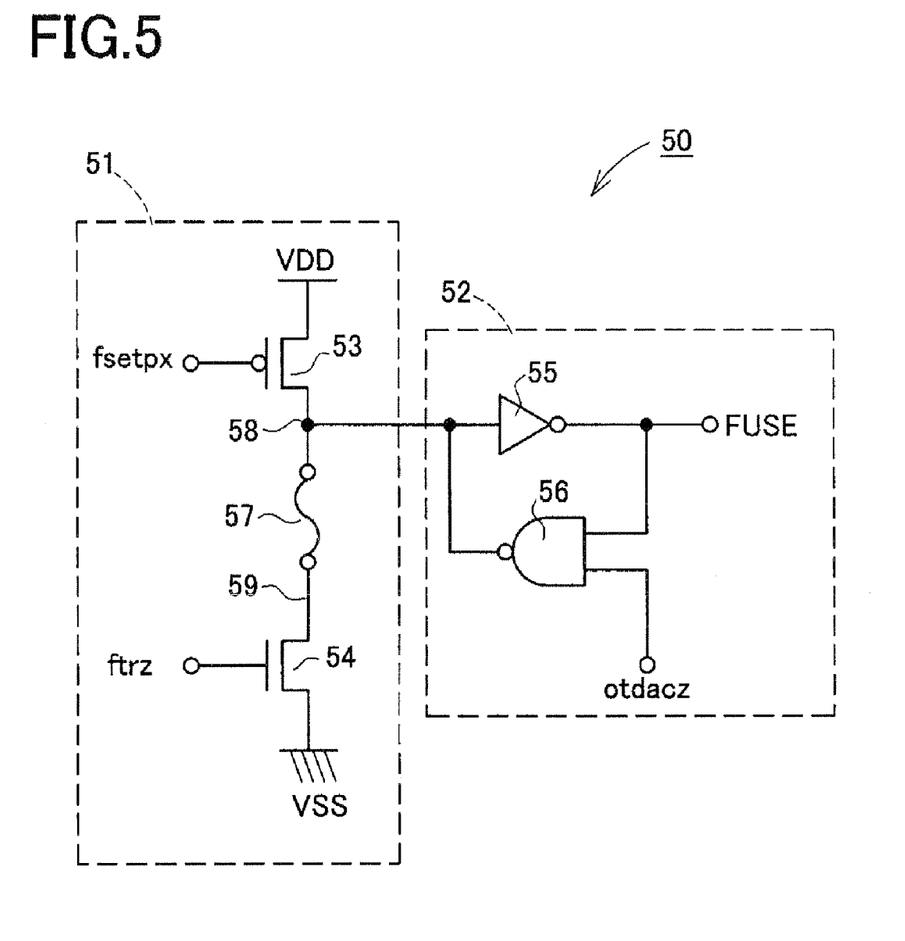
FIG. 5 is a circuit diagram showing a fuse circuit of Embodiment 2.

FIG. 5 is an example of applying the invention as Embodiment 2 to a fuse circuit 50. The fuse circuit 50 comprises a fuse portion 51 and a holding portion 52 but has no transfer portion. Control signals fsetpx and ftrz are inputted to PMOS transistor 53 and an NMOS transistor 54 of the fuse portion 51 respectively. The fuse 57 is connected between nodes 58 and 59. The PMOS transistor 53 is connected between the node 58 and the power source voltage VDD. The NMOS transistor 54 is connected between the node 59 and the ground voltage VSS. In the holding portion 52, input and output terminals of an inverter gate 55 and an NAND gate 56 are connected to each other. The input terminal of the inverter gate 55 is connected with the node 58 in the fuse portion 51. A command entry signal otdacz is inputted to the other input terminal of the NAND gate 56. The holding portion 52 constitutes a latch circuit corresponding to the logic inversion function of the NAND gate 56 in accordance with the command entry signal otdacz at a high level. It holds the voltage level inputted from the node 58 and outputs a fuse information as the inverted signal thereof as a fuse signal FUSE.

Control signals fsetpx and ftrz are generated by the generation circuit 30 (FIG. 3). The operation timing for the control signals fsetpx and ftrz is as shown in FIG. 4. In Embodiment 2, the signal ftrz is used not as a transfer signal but as a control signal. In the fuse portion 51, the PMOS transistor 53 controlled by the control signal fsetpx. The control signal fsetpx transits to a low level by the removal of the power-ON reset signal POR and then again transits to the high level by the command entry signal otdacz by the first command after turning-ON of the power source. The PMOS transistor 53 turns ON during a period where the control signal fsetpx is at the low level to connect the power source voltage VDD to the node 58. The MNOS transistor 54 is controlled by the control signal ftrz. The control signal ftrz transits to the low level by the command entry signal otdacz. The NMOS transistor 54 turns ON during period where the control signal ftrz is at the high level thereby connecting the ground voltage VSS to the node 59 and turns OFF in the subsequent low level.

As described above, the PMOS transistor 53 and the NMOS transistor 54 turn ON simultaneously during the transfer period from the removal of the power-ON reset signal POR to the generation of the command entry signal otdacz. Further, during the transfer period, since the command entry signal otdacz is at the low level, one of the PMOS transistors constituting the NAND gate 56 also turns ON. However, it is adapted that the current driving performance of the NMOS transistor 54 is made larger compared with the sum for the current driving performance of the PMOS transistor 53 and the current driving performance of the PMOS transistor constituting the NAND gate 56.

In a case where the fuse is not fused, the PMOS transistor 53 and the NMOS transistor 54 turn ON simultaneously with the control signals fsetpx and ftrz at the node 58. At this instance, the PMOS transistor constituting the NAND gate 56 also turns ON, and the PMOS transistors turns ON in parallel to connect the node 58 with the power source voltage VDD. However, since the NMOS transistor 54 has larger current driving performance compared with the current driving performance of the PMOS transistor by parallel connection, the node 58 is at the low level.

In a case where the fuse is fused, the PMOS transistor 53 and the NMOS transistor 54 turn ON simultaneously by the control signals fsetpx and ftrz at the node 58. However, the path from the node 58 to the NMOS transistor 54 is shut by the fusion of the fuse. Accordingly, the node 58 is at the high level.

In the holding portion 52, the NAND gate 56 performs the logic inversion function by the transition of the command entry signal otdacz to the high level, and a latch circuit is constituted with respect to the inverter gate 55. The fuse information is held and outputs as the fuse signal FUSE. In a case where the fuse is not fused, the low level at the mode 58 is held, which is inverted by the inverter gate 55 and the fuse signal FUSE at the high level is outputted. In a case where the fuse is fused, the high level at the mode 58 is held, which is inverted by the inverter gate 55 and the fuse signal FUSE at the low level is outputted. The same effect as for the fuse signal FUSE in Embodiment 1 (refer to FIG. 4) is obtained.

In this case, since the reading period for the fuse information is sufficiently long and, in addition, since the first command is inputted after the power source voltage VDD rises sufficiently and is stabilized thereby capable of defining the fuse information and correct information can be reliably held.

Erroneous operation caused by the effect of the parasitic load in the signal wiring and on the power source wiring can be prevented even in a case where the fuse circuit 50 is situated at any position in the device.

Further, the fuse information is defined and held in the holding portion 52 by the command entry signal ordacz. Thus, the fuse information has been defined at the stage before the operation by the command and erroneous inversion of the fuse information due to the power source noises generated by the command operation does not occur.

As has been described above specifically, in the semiconductor device according to this embodiments and the control method therefor, a sufficiently long time from the transition to the low level of the power-ON reset signal POR as an example of first initialization signal which is the first initialization operation instruction after the turning-ON of the power source till the transition to the high level of the command entry signal otdacz as an example of the second initialization signal which is the input of the first command as the second initialization instruction can be ensured as the reading time for the fuse information as the control parameter information.

Further, the fuse information may be held in the holding portions 4, 52 after the reading period with a sufficient time being ensured and it is not necessary to control the signal transition timing between the reading operation and the holding operation of the fuse information. The operation margin for the reading operation and the holding operation does not become insufficient by the competition of the transition timings between the signals and the holding operation can be conducted after the stable reading operation.

Further, since sufficient reading period is ensured, even in a case where the fuse information is arranged being distributed as fuse circuits 402A, 402B, 402C at appropriate positions on the semiconductor device, individual fuse information can be read reliably irrespective of the difference of the load on the supply path 405 of the power source voltage VDD and the load on the signal transmission path 404.

Further, after the completion for the reading of the fuse information, the ground voltage VSS as the second power source is supplied to the node 16 as the first node. In addition to the supply of the ground voltage VSS to the node 17 as the second node, the nodes at both ends of the fuse 15 in the fuse portion 2 as the information storage portion are at an identical potential thereby capable of removing the voltage stress applied to the fuse 15. The aging degradation of the fuse 15 due to the voltage stress such as glow back phenomenon, etc. can be prevented.

Further, by the delay portion 31, the signals fclz, and fsetpdx transit to a high level after the delay time τ from the high level transition of the command entry signal otdacz. Accordingly, after the PMOS transistor 5 as a first switch portion is rendered non conductive and after shutting of the power supply path of the power source voltage VDD as the first power source, the ground voltage VSS can be supplied to the node 16 or the node 17. Occurrence of the through current between the power source voltage VDD and the ground voltage VSS can be prevented.

Further, upon starting the reading for the fuse information, the NMOS transistor 7 as the third switch portion becomes conductive to connect the node 18 as the third node by way of the transfer portion 3 to the ground voltage and, at the same time, the PMOS transistor 9 as a fourth switch portion becomes non-conductive to shut the path from the power source voltage VDD to the node 18. Accordingly, upon starting the reading for the fuse information, the node 18 is initialized to the ground voltage VSS to initialize the holding portion 4.

Further, power-ON reset signal POR is outputted when the voltage level of the power source voltage VDD reaches a predetermined value. Therefore, the subsequent power source voltage VDD is at a sufficient voltage level. The reading operation and the holding operation for the fuse information can be conducted reliably by the power source voltage VDD at a sufficient voltage level.

Further, as the timing for the completion of the reading for the fuse information, the command entry signal otdacz can be utilized. The reading operation and the holding operation for the fuse information are completed at the issue of the first command and it is not necessary to delay the timing for starting the command operation for the reading operation or the holding operation. The circuit operation based on the first command includes no delay and can maintain high speed operation performance. Further, there are no power source noises, etc. caused by the circuit operation based on the command upon reading the fuse information and erroneous inversion of the fuse information does not occur. Accordingly, erroneous information is not held.

The present invention is not limited to the embodiments described above but, naturally, the invention can be improved or modified variously within a scope not departing from the gist of the invention.

The present invention can provide a semiconductor device and a control method therefor capable of reliably reading the control parameter information from the information storage portion and holding the same in the internal circuit upon turning-ON of the power source with a sufficient reading time and at a sufficient power source voltage and not causing delay of the first command operation by the reading operation and the holding operation.

What is claimed is:

1. A semiconductor device comprising:
    an information storage portion in which control parameter information is stored, reading of the control parameter information is started based on a first initialization signal instructing a first initialization operation after turning-ON of the power source, reading of the control parameter information is completed based on a second initialization signal instructing a second initialization operation, and the second initialization signal is output in case the semiconductor device detects a command that first becomes active among input commands;
    an information holding portion for holding the control parameter information read from the information storage portion; and
    an initial command detection portion for detecting the first command after the turning-ON of the power source,
    wherein the second initialization signal is an initial command detection signal outputted from the initial command detection portion.

2. A semiconductor device according to claim 1, wherein the held control parameter information is defined based on the second initialization signal in the information holding portion.

3. A semiconductor device according to claim 2, wherein the control parameter information is defined by shutting the input of the control parameter information to the information holding portion.

4. A semiconductor device according to claim 2, wherein the control parameter information is defined by the start of the holding operation in the information holding portion.

5. A semiconductor device according to claim 1, comprising:
    a power source detection portion for detecting the turning-ON of the power source, wherein the first initialization signal is a power-ON reset signal outputted from the power source detection portion.

6. A semiconductor device comprising:
    an information storage portion connected between a first node and a second node for storing the control parameter information;
    a first switch portion connected between the first node and a first power source, and rendered conductive based on a first initialization signal for instructing a first initialization operation after turning-ON of the power source and rendered non-conductive based on a second initialization signal for instructing a second initialization operation;
    a second switch portion connected between the second node and a second power source, and rendered conductive before conduction of the first switch portion based on the first initialization signal, rendered non-conductive during the conduction period of the first switch portion and, further, rendered conductive after non-conduction of the first switch portion based on the second initialization signal;

a transfer portion connected between the second node and a third node, and rendered non-conductive before the conduction of the second switch portion based on the second initialization signal; and an information holding portion connected with the third node and holding the control parameter information transmitted to the third node.

7. A semiconductor device according to claim 6, comprising:

a third switch portion connected between the first node and the second power source, and rendered conductive after non-conduction of the transfer portion based on the second initialization signal.

8. A semiconductor device according to claim 6, comprising:

a delay portion that outputs a delay signal being delayed relative to the second initialization signal, wherein at least one of the second switch portion or the third switch portion is rendered conductive based on the delay signal.

9. A semiconductor device according to claim 6, wherein the third node is initialized to the second power source level based on the first initialization signal.

10. A semiconductor device according to claim 9, wherein the information holding portion comprises a fourth switch portion, in the path for supplying the first power source to the third node, rendered non-conductive based on the first initialization signal in synchronization with conduction of the second switch portion based on the first initialization signal.

11. A semiconductor device according to claim 6, comprising:

a power source detection portion for detecting the turning-ON of the power source, wherein the first initialization signal is a power-ON reset signal outputted from the power source detection portion.

12. A semiconductor device according to claim 6, comprising:

an initial command detection portion for detecting the first command after the turning-ON of the power source, wherein the second initialization signal is an initial command detection signal outputted from the initial command detection portion.

13. A method of controlling a semiconductor device, including:

starting reading of stored control parameter information based on a first initialization operation instruction after the turning-ON of the power source;

completing the reading based on a second initialization operation instruction which is made in case the semiconductor device detects a command that first becomes active among input commands; and holding the control parameter information read out until completing the reading, wherein the second initialization operation instruction is conducted based on an initial command after the turning-ON of the power source.

14. A control method for a semiconductor conductor device according to claim 13, wherein the first initialization operation instruction after the turning-ON of the power source is conducted when the turned-ON power source reaches a predetermined voltage level.

* * * * *